United States Patent
Sung et al.

(10) Patent No.: US 9,324,799 B2
(45) Date of Patent: Apr. 26, 2016

(54) FINFET STRUCTURES HAVING UNIFORM CHANNEL SIZE AND METHODS OF FABRICATION

(71) Applicant: GLOBALFOUNDRIES Inc., Grand Cayman (KY)

(72) Inventors: Min Gyu Sung, Latham, NY (US); Kwan-Yong Lim, Niskayuna, NY (US); Sukwon Hong, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/480,974

(22) Filed: Sep. 9, 2014

(65) Prior Publication Data

US 2016/0071932 A1 Mar. 10, 2016

(51) Int. Cl.
| | |
|---|---|
| *H01L 29/78* | (2006.01) |
| *H01L 21/336* | (2006.01) |
| *H01L 29/10* | (2006.01) |
| *H01L 29/66* | (2006.01) |
| *H01L 21/762* | (2006.01) |
| *H01L 29/36* | (2006.01) |
| *H01L 27/092* | (2006.01) |
| *H01L 21/8238* | (2006.01) |
| *H01L 29/06* | (2006.01) |

(52) U.S. Cl.
CPC ...... *H01L 29/1033* (2013.01); *H01L 21/76224* (2013.01); *H01L 21/823807* (2013.01); *H01L 21/823821* (2013.01); *H01L 27/0924* (2013.01); *H01L 29/0649* (2013.01); *H01L 29/36* (2013.01); *H01L 29/66795* (2013.01); *H01L 29/7851* (2013.01)

(58) Field of Classification Search
None
See application file for complete search history.

(56) References Cited

U.S. PATENT DOCUMENTS

2011/0042748 A1* 2/2011 Anderson ......... H01L 29/66795
257/365

* cited by examiner

*Primary Examiner* — Khaja Ahmad
(74) *Attorney, Agent, or Firm* — Heslin Rothenberg Farley and Mesiti PC; Nicholas Mesiti

(57) ABSTRACT

Methods of fabricating circuit structures including FinFET structures are provided, including: providing a substrate and a first material having a first threshold voltage above the substrate, and a second material having a second threshold voltage lower than the first threshold voltage above the first material; forming fins having base fin portions formed from the first material and upper fin portions formed from the second material; providing gate structures over the fins to form one or more FinFET structures, wherein the gate structures wrap around at least the upper fin portions and have an operating voltage lower than the first threshold voltage and higher than the second threshold voltage, so that the upper fin portions define a channel size of the one or more FinFET structures. Circuit structures including FinFET structures are also provided, in which the FinFET structures have a uniform channel size defined only by upper fin portions thereof.

20 Claims, 8 Drawing Sheets

FINFET STRUCTURES HAVING UNIFORM CHANNEL SIZE AND METHODS OF FABRICATION

FIELD OF THE INVENTION

The present invention generally relates to fabricating circuit structures, and more specifically, to fin structures and methods of fabrication thereof.

BACKGROUND

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a generally vertically-oriented structure within or upon which are formed, for instance, one or more FinFETs or other fin devices, such as passive devices, including capacitors, diodes, etc. Demands for smaller device sizes and challenges in fabricating FinFETS with uniform physical and electrical properties continue to drive development of new techniques of fin fabrication.

SUMMARY OF THE INVENTION

The shortcomings of the prior art are overcome and additional advantages are provided through the provision, in one aspect, of a method including: providing a substrate and a first material having a first threshold voltage above the substrate, and a second material above the first material, the second material having a second threshold voltage lower than the first threshold voltage; forming one or more fins above the substrate, the one or more fins having base fin portions formed from the first material and upper fin portions formed from the second material, the upper fin portions having outer surfaces; providing gate structures over the one or more fins to form one or more FinFET structures, wherein the gate structures wrap around at least a portion of the outer surfaces of the upper fin portions; and wherein an operating voltage of the gate structures is lower than the first threshold voltage and higher than the second threshold voltage, so that the upper fin portions define a channel size of the one or more FinFET structures.

Also provided herein, in another aspect, is a structure including a circuit structure with one or more FinFET structures above a substrate, the one or more FinFET structures including: one or more fins above the substrate, the one or more fins having base fin portions of a first material having a first threshold voltage and upper fin portions of a second material having a second threshold voltage, the second threshold voltage being lower than the first threshold voltage; gate structures over the one or more fins, the gate structures wrapping around at least a portion of the upper fin portions of the one or more fins; wherein an operating voltage of the gate structures is lower than the first threshold voltage and higher than the second threshold voltage, so that a channel size of the one or more FinFET structures is defined only by the upper fin portions of the one or more fins.

Additional features and advantages are realized through the techniques of the present invention. Other embodiments and aspects are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
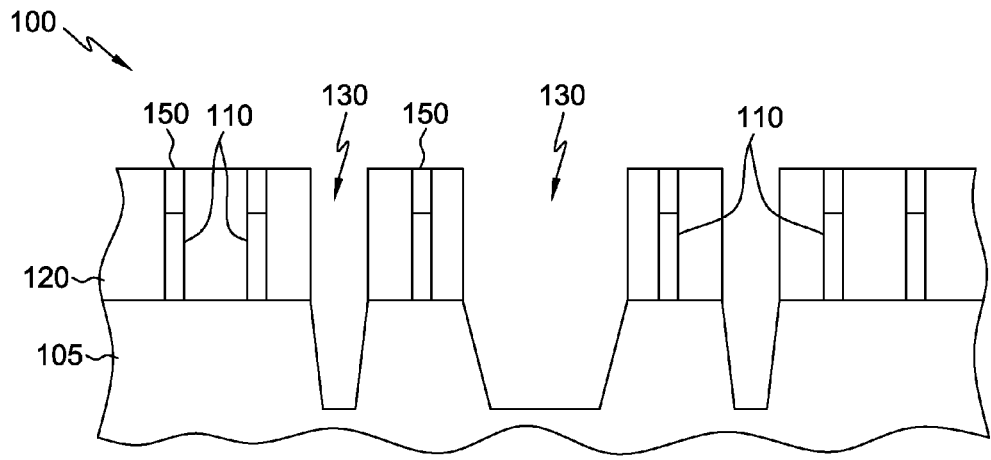
FIGS. 1A-1C depict one embodiment of at least part of a process for forming one or more circuit structures, illustrating problems to be addressed by processing and structures in accordance with one or more aspects of the present invention herein.

FIG. 1A depicts a cross-sectional view of a portion of one embodiment of a structure 100 at an intermediate fabrication step, illustrating conventional circuit structure fabrication methods. Structure 100 includes a substrate 105 that includes one or more fins 110 above the substrate and a first dielectric material 120 disposed between or around the one or more fins 110. Fins 110 may, in general, be formed by applying a patterned mask 110a, such as a patterned silicon nitride hard mask, over a bulk semiconductor substrate, such as a silicon wafer, and etching fins 110. Following fin etching, a first dielectric material 120 may be disposed between fins 110 to, in part, electrically isolate fins 110 from each other. Fabrication techniques for many circuit structures, such as SRAM unit cells, include a "fin cutting" step to remove portions of certain fins, or entirely removing other fins, to form trenches 130 in substrate 105. As discussed below, trenches 130 are formed to form, in part, isolation trenches between fins within a single circuit structure, and/or between two or more separate circuit structures on the same substrate 105.

Figure 1B:
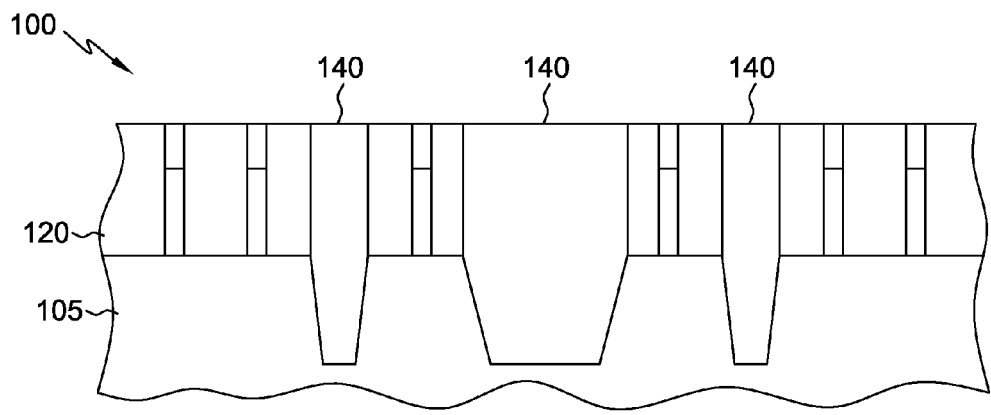
Figure 1C:
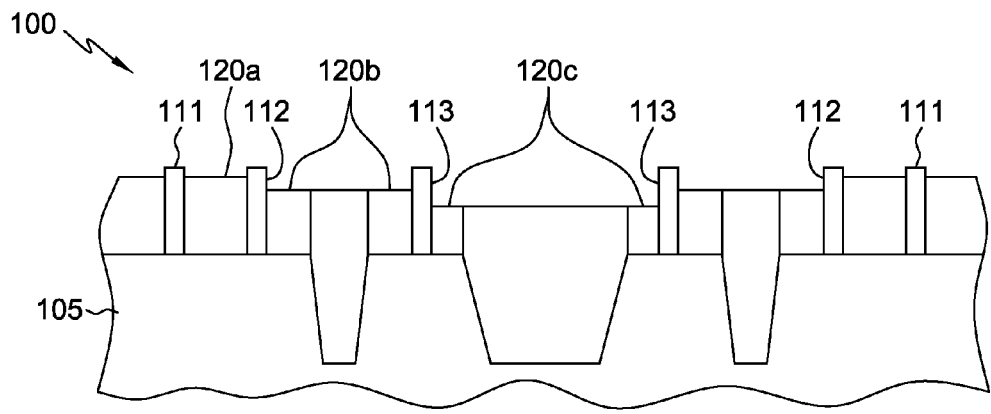

FIG. 1B depicts structure 100 following disposal of a second dielectric material 140 in the trenches 130 of FIG. 1A. Second dielectric material 140 is disposed in the trenches to form isolation trenches that electrically isolate separate circuit structures, such as two adjacent transistors formed in the same substrate, or that electrically isolate features within a single circuit structure, such as a p-type FinFET and an n-type FinFET within a single transistor. Second dielectric material 140 may be the same material as first dielectric material 120. Although first and second dielectric materials 120 and 140 need not be identical materials, the first and second dielectric materials are generally both susceptible to the same recessing technique so that both may be recessed in a single step, as illustrated by FIG. 1C and described below. Generally both first dielectric material 120 and second dielectric material 140 are different type of materials from the material of patterned mask 110a, so that fabrication steps that may affect first and second dielectric materials 120 and 140, such as recessing first and second dielectric materials, do not affect patterned mask 110a and vice versa.

FIG. 1C depicts structure 100 following exposure of upper fin portions 111, 112, 113 of the fins via recession of first dielectric material 120 and second dielectric material 140, as well as removal of remaining patterned mask 110a. Recession of first and second dielectric materials 120, 140 may be accomplished, for example, by etching first and second dielectric materials 120, 140 at an etch rate that depends on a spacing or "pitch" between fins. For example, common dry etching techniques may recess dielectric material 120 at a slower rate between two fins separated by a relatively small pitch, such as between fins 111 and 112 in FIG. 1C, while the same dry etching process may recess first and second dielectric materials 120, 140 more rapidly between two fins separated by a relatively large pitch, as between fins 112 and 113. Thus, the same recessing process may result in unequal recession of first dielectric material 120a, 120b, 120c between different pairs of fins, further resulting in upper fin portions 111, 112, and 113 having unequal heights above the first dielectric material.

In subsequent processing steps, a gate material may be formed over upper fin portions 111, 112, 113 to form FinFET structures, defining, in part, one or more circuit structures. As the gate material generally only contacts the exposed upper fin portions of the one or more fins, the physical sizes of exposed upper fin portions 111, 112, 113 define the channel sizes of the formed FinFET structures. Consequently, the uneven sizes of upper fin portions 111, 112, 113 result in FinFET structures with different physical and electrical properties. In particular the FinFET structures may have variable channel sizes of the FinFET structures and, consequently, variable threshold voltages for operation of the FinFETs within a single circuit structure and among separate circuit structures, resulting in circuit structures with sub-optimal or undesirably variable performance. Thus, there is a need for novel FinFET structures and methods for fabricating FinFET structures that have a uniform channel size. Ideally, fins having a uniform channel size may be achieved using existing fabrication tools and materials to reduce fabrication costs associated with newer tools.

Generally stated, provided herein in one aspect is a method including: providing a substrate and a first material having a first threshold voltage above the substrate, and a second material above the first material, the second material having a second threshold voltage lower than the first threshold voltage; forming one or more fins above the substrate, the one or more fins having base fin portions formed from the first material and upper fin portions formed from the second material, the upper fin portions having outer surfaces; providing gate structures over the one or more fins to form one or more FinFET structures, wherein the gate structures wrap around at least a portion of the outer surfaces of the upper fin portions; and wherein an operating voltage of the gate structures is lower than the first threshold voltage and higher than the second threshold voltage, so that the upper fin portions define a channel size of the one or more FinFET structures.

In another aspect, provided herein is a structure including a circuit structure with one or more FinFET structures above a substrate, the one or more FinFET structures including: one or more fins above the substrate, the one or more fins having base fin portions of a first material having a first threshold voltage and upper fin portions of a second material having a second threshold voltage, the second threshold voltage being lower than the first threshold voltage; gate structures over the one or more fins, the gate structures wrapping around at least a portion of the upper fin portions of the one or more fins; wherein an operating voltage of the gate structures is lower than the first threshold voltage and higher than the second threshold voltage, so that a channel size of the one or more FinFET structures is defined only by the upper fin portions of the one or more fins.

Figure 2A:
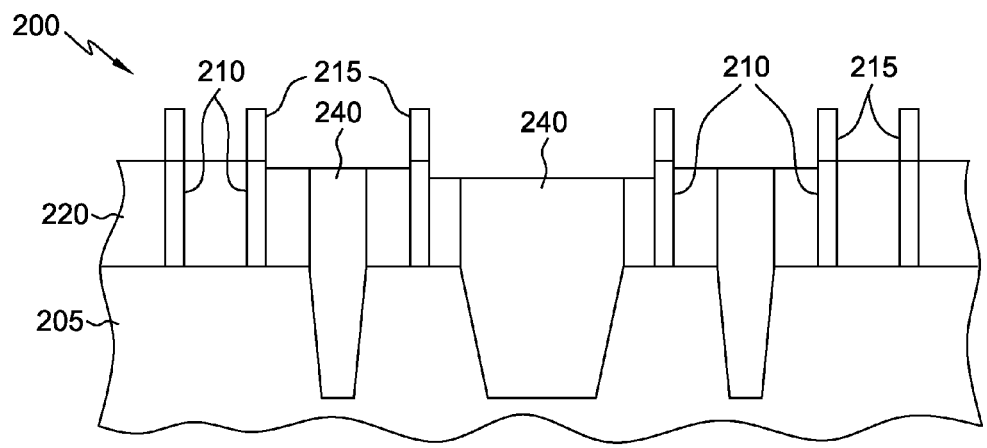
FIGS. 2A-2B depict portions one embodiment of a structure designed to address one or more issues illustrated in FIGS. 1A-1C, in accordance with one or more aspects of the present invention.
Figure 2B:
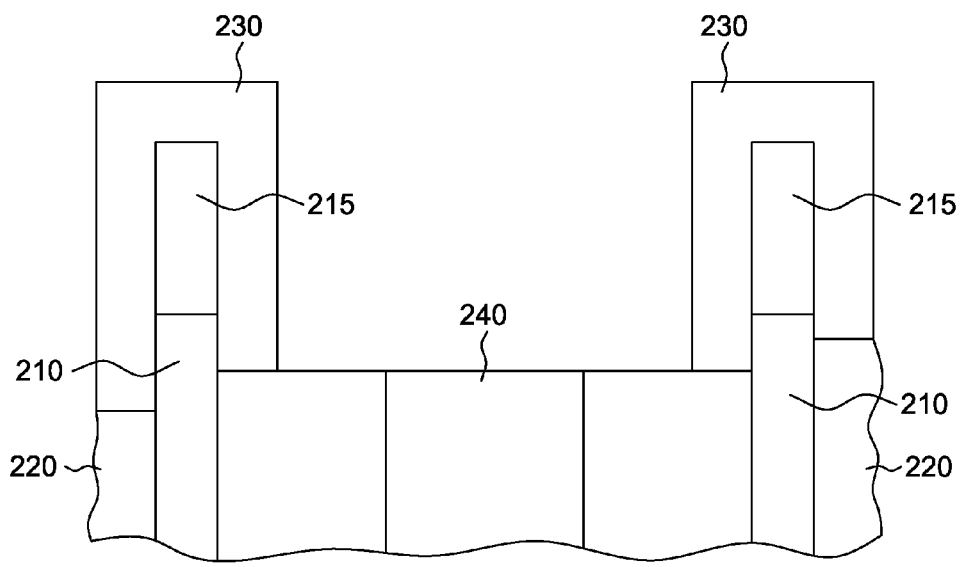

FIGS. 2A-2B provide cross-sectional depictions of one embodiment of such a structure including FinFET structures in which the channel size of a FinFET structure is defined only by the upper fin portion of the fin in the FinFET structure. FIG. 2A depicts a cross-section of at least a portion of one embodiment of a structure 200 with fins that partially form FinFET structures having a uniform channel size. Structure 200 includes a substrate 205, one or more fins 210/215 above substrate 205, and a first dielectric material 220 and second dielectric material 240 disposed between the plurality of fins 210/215. The one or more fins 210/215 include base fin portions 210 of a first material and upper fin portions 215 of a second material. The first material of base fin portions 210 has a first threshold voltage and the second material of upper fin portions 215 has a second threshold voltage lower than the first threshold voltage. As may be understood by those with skill in the art, the threshold voltage of a material is a minimum voltage at which, when applied to the material, the material begins to conduct electrical current; the threshold voltage of a material may depend, in part, on the specific physical and/or electrical properties of the material.

As illustrated by FIG. 2A, first dielectric material 220 and second dielectric material 240 are recessed to a depth sufficient to expose at least the outer surfaces of upper fin portions 215. First and second dielectric materials 220 and 240 may, for example, be recessed by etching the dielectric materials 220/240 at an etch rate that depends on a spacing or "pitch" between fins, as discussed above and illustrated in FIG. 1C, resulting in dielectric materials 220/240 being etched to a greater depth between widely-spaced fins and to a lesser depth between closely-spaced fins. Unlike the structure depicted in FIG. 1C, however, only upper fin portions 215 of the plurality of fins 210/215 define the channel sizes of FinFET structures formed from fins 210/215, as described further below, due to the first threshold voltage of the base fin portions 210 being higher than the second threshold voltage of the upper fin portions 215. Thus, so long as first and second dielectric materials 220/240 are recessed to at least a depth sufficient to expose the outer surfaces of upper fin portions 215, structure 200 may have first and second dielectric materials 220, 240 recessed to variable depths over the structure 200 without affecting the channel sizes of subsequently formed FinFET structures.

FIG. 2B depicts a closer cross-sectional view of two fins 210/215 of the one or more fins of FIG. 2A with gate structures 230 provided over the one or more fins to form one or more FinFET structures. As depicted in the example embodiment in FIG. 2B, gate structures 230 wrap around at least a part of upper fin portions 215 (that is, the part of upper fin portions 215 that define the channel of FinFET structures in a transistor) so as to fully contact upper fin portions 215 on each side of and on top of upper fin portions 215. At least one gate structure of gate structures 230 may also contact at least a portion of a base fin portion 210 of a respective at least one fin of at least one FinFET structure. As FIG. 2B shows, the size of the portions of base fin portions 210 contacted by gate structures 230 may vary between different FinFET structures. However, gate structures 230 are selected to have an operating voltage (or gate bias) that is higher than the second threshold voltage of upper fin portions 215 and lower than the first threshold voltage of base fin portions 210. Thus, when the operating voltage is applied to gate structures 230 during operation of structure 200, current may flow in upper fin portions 215 but may not flow in base fin portions 210. The channel size of each FinFET structure is thus only defined by upper fin portions 215 as current only flows in those upper fin portions during operation and not in base fin portions 210. In exemplary embodiments, upper fin portions 215 of the one or more FinFET structures in both FIGS. 2A and 2B have a uniform height above the base fin portions so that the one or more FinFET structures have a uniform channel size. Thus, regardless of the depth to which dielectric materials 220/240 have been recessed or variations in the recession of dielectric materials 220/240, the FinFET structures formed from the one or more fin structures 210/215 may have a uniform channel size defined only by upper fin portions 215.

Figure 3A:
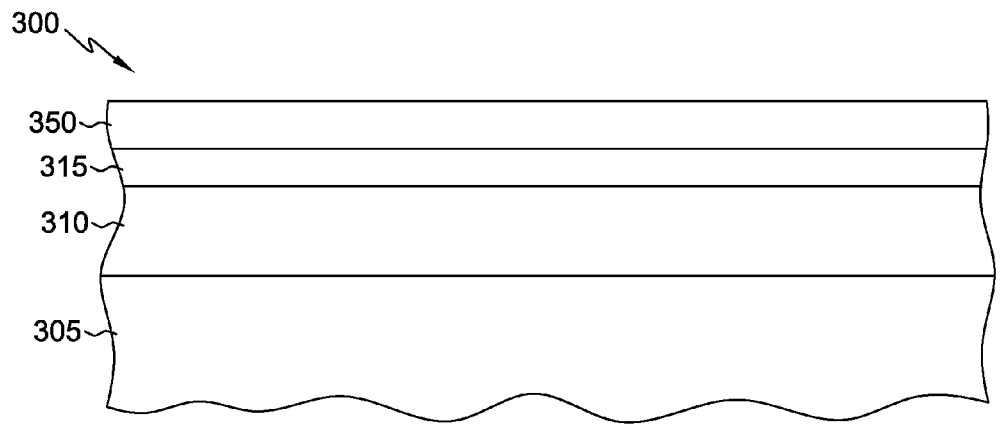
FIGS. 3A-3D illustrate one embodiment of a method for fabricating embodiments of the structure illustrated by FIGS. 2A-2B, in accordance with one or more aspects of the present invention.

FIGS. 3A-3D depict one embodiment of a method for forming one embodiment of a structure depicted in FIGS. 2A-2B. FIG. 3A depicts one embodiment of a structure 300 including a substrate 305, a first material 310 provided above the substrate, and a second material 315 provided above the first material. First material 310 has a first threshold voltage that may, for example, be defined in part by a first band-gap of the first material. Similarly, second material 315 has a second threshold voltage that may, for example, be defined in part by a second band-gap of the second material, and that is smaller than the first threshold voltage of the first material. The "band-gap" of a material, as may be understood in the art, is the difference in energy level between the uppermost valence band of the material and the lowest conduction band of the material. Generally, materials that have a band-gap (i.e., semiconductors and electrical insulators) conduct current only when a voltage is applied to the material. Materials with a narrow or smaller band-gap require a proportionately lower threshold voltage applied to conduct current than materials with a wide or larger band-gap. In one exemplary embodiment, first material 310 and second material 315 may each include aluminum-gallium arsenide ($Al_xGa_{1-x}As$, where x is a value between 0 and 1), with first material 310 having a higher concentration of aluminum than second material 315, and second material 315 consequently having a higher concentration of gallium than first material 315. This results in first material 310 having a larger band-gap, and corresponding higher threshold voltage, than second material 315. Advantageously, using aluminum-gallium arsenide for both the first material 310 and second material 315 may minimize lattice defects at an interface between first material 310 and second material 315, as the two materials may have substantially the same lattice constant in spite of the different concentrations of aluminum and gallium between the two materials. It may be understood that other suitable first materials and second materials may also be used in alternative embodiments.

Providing second material 315 above first material 310 may include forming a layer of the second material 315 to a uniform thickness above first material 310. The uniform thickness of second material 315 may subsequently facilitate forming upper fin portions from second material 315 that have a uniform height above base fin portions formed from first material 310, as described below. As depicted in FIG. 3A, structure 300 may also include a masking layer 350, such as a patterned hard mask layer that may be used to pattern fins out of first material 310 and second material 320.

Figure 3B:
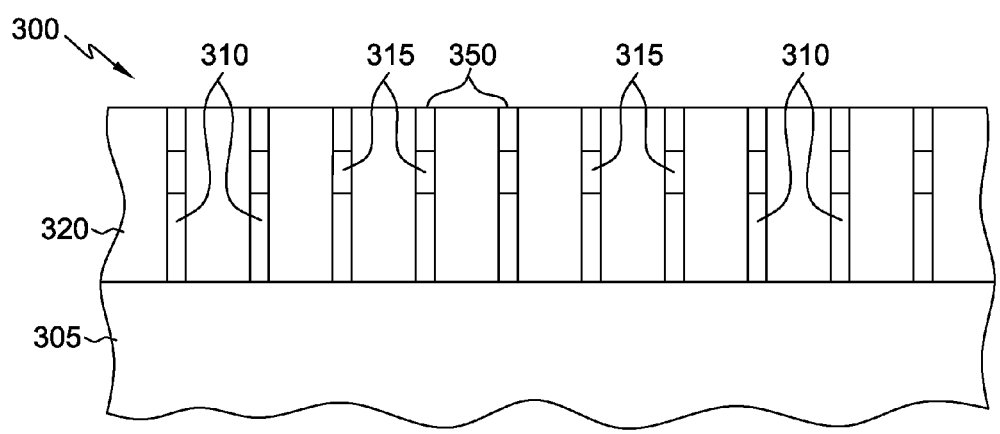

FIG. 3B depicts the structure 300 of FIG. 3A following forming of one or more fins above the substrate and deposition of a first dielectric material 220 between the one or more fins. The one or more fins 310/315 may be formed, for example, by using a masking layer 350, such as a patterned hard mask layer, to etch one or more trenches through masking layer 350, second material 315, and first material 310 to define fins above substrate 305. The one or more fins have base fin portions 310 formed from the first material and upper fin portions 315 formed from the second material, the upper fin portions having outer surfaces around which gate structures may subsequently be formed. First dielectric material 220 may be disposed between fins 310/315 to, for example, electrically isolate fins 310/315.

Figure 3C:
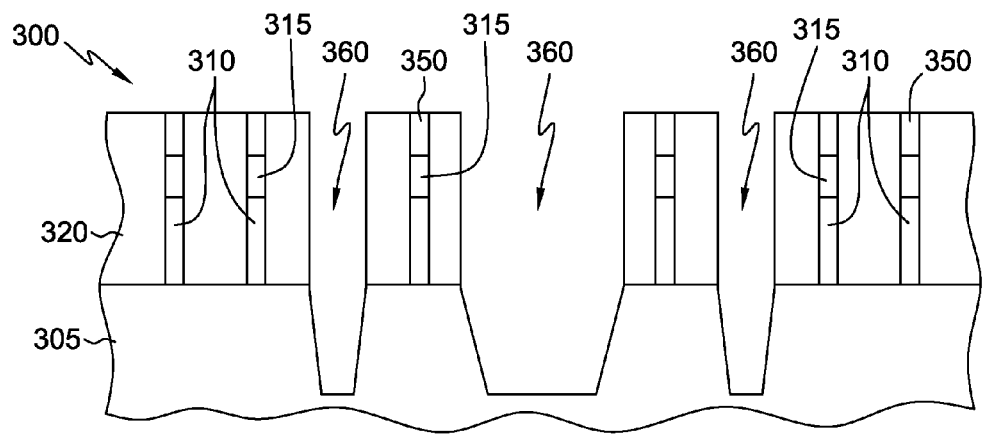

FIG. 3C depicts the structure 300 of FIG. 3B following removing at least a portion of at least one of the one or more fins 310/315, in which the removing forms at least one trench 360 in the substrate 305. As discussed above, fabrication techniques for many circuit structures, such as SRAM unit cells, include a "fin cutting" step to remove portions of at least one fin, or to remove portions of several fins as well as remove entire fins, in order to form isolation trenches between remaining fins within a circuit structure and/or between separate circuit structures formed on the same substrate 305. The removing of at least a portion of at least one of the one or more fins 310/315 may, for example, be accomplished by a lithographic etching in which, for instance, a patterned photoresist (not depicted) is used to protect some fins from etching and allow other fins, along with a portion of the underlying substrate 305, to be etched.

Figure 3D:
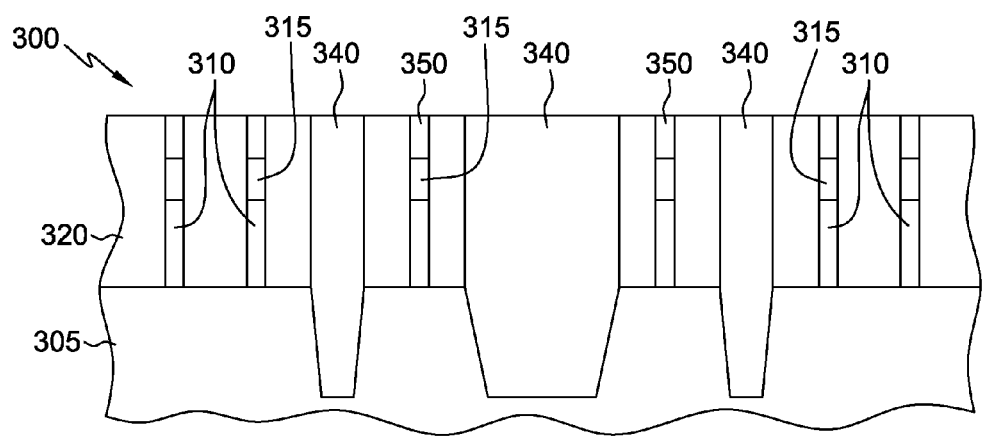

FIG. 3D depicts the structure 300 of FIG. 3C following providing of a second dielectric material 340 in the at least one trench 360 of FIG. 3C. First dielectric material 320 and second dielectric material 340 may, in one example, be planarized with patterned masking layer 350, such as by chemical-mechanical planarization, to achieve an initially uniform surface of first and second dielectric materials 320 and 340. First dielectric material 320 and second dielectric material 340 may subsequently be recessed, such as by a dry-etching technique, to a depth sufficient to expose at least the outer surfaces of upper fin portions 315, thus achieving, in at least one embodiment, the intermediate structure depicted in FIG. 2A. Gate structures, such as the gate structures 230 of FIG. 2B, may subsequently be provided to wrap around at least a portion of the outer surfaces of upper fin portions 315 to form one or more FinFET structures. The gate structures may have an operating voltage lower than the first threshold voltage of the first material of base fin portions 310 and higher than the second threshold voltage of the second material of upper fin portions 315, so that a channel size of the resulting FinFET structures is defined only by the upper fin portions 315, as described above. For example, in embodiments in which base fin portions 310 and upper fin portions 315 include aluminum-gallium arsenide, as described above, the gate structures may also be formed of aluminum-gallium arsenide ($Al_xGa_{1-x}As$, where x is a value between 0 and 1) so that the gate structures have a higher aluminum concentration than upper fin portions 315 and a lower aluminum concentration than base fin portions 310, resulting in gate structures with a higher threshold voltage than the upper fin portions and a lower threshold voltage than the base fin portions. In exemplary embodiments, upper fin portions 315 of the resulting one or more FinFET structures have a uniform height above the base fin portions so that the one or more FinFET structures have a uniform channel size.

Figure 4A:
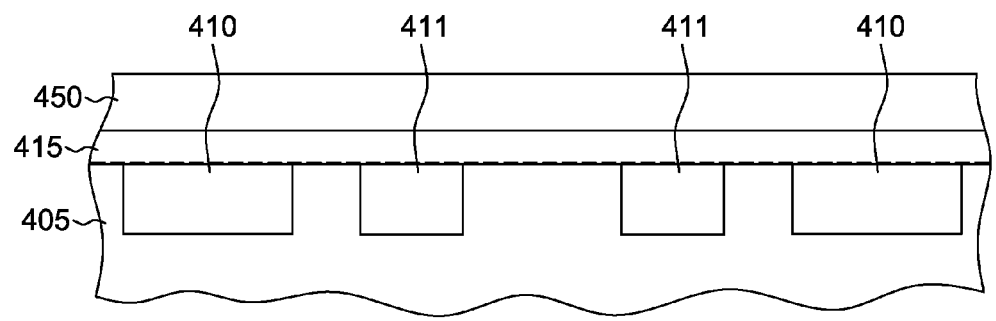
FIGS. 4A-4G illustrate an alternative embodiment of a method for fabricating embodiments of the structure illustrated by FIGS. 2A-2B, in accordance with one or more aspects of the present invention.

FIGS. 4A-4G depict an alternative embodiment of a method for forming another embodiment of the structure depicted in FIGS. 2A-2B. FIG. 4A depicts one embodiment of a structure 400 including a substrate 405 and a first material 410 provided by implanting a first dopant into at least a portion of the substrate to form at least one doped region 410 in the substrate. A second material 415 is provided above the at least one doped region 410 and substrate 405. In exemplary embodiments, second material 415 may be the same material as substrate 405, such as silicon. Providing second material 415 above first material 410 may include forming a layer of the second material 415 to a uniform thickness above first material 410. The uniform thickness of second material 415 may subsequently facilitate forming upper fin portions from second material 415 that have a uniform height above base fin portions formed from first material 410, as described below. As described further below, upper fin portions formed of second material 415 above base fin portions formed of first material 410 may, prior to providing gate structures over formed fin structures, be implanted with a second dopant. Generally, to form operable FinFET structures, the first dopant and second dopant may have the same dopant or conductivity type. For example, both the first dopant and second dopant may be n-type dopants such as phosphorous or arsenic. Structure 400 may also include a masking layer 450, such as a patterned hard mask layer, over second material 415.

FIG. 4A further depicts structure 400 as including a third material 411 above the substrate 405, the third material 411 being provided by implanting a third dopant into a second portion of the substrate to form a second doped region 411. Second material 415 is also provided over second doped region 411. As described further below, upper fin portions formed of second material 415 above base fin portions formed of third material 411 may, prior to providing gate structures over formed fin structures, be implanted with a fourth dopant. The third and fourth dopants may have the same dopant or conductivity type. Further, the third and fourth dopants may have a dopant type opposite the dopant type of the first and second dopants. For example, where first doped region 410 is implanted with an n-type dopant such as phosphorous or arsenic, second doped region 411 may be implanted with a p-type dopant such as boron.

Figure 4B:
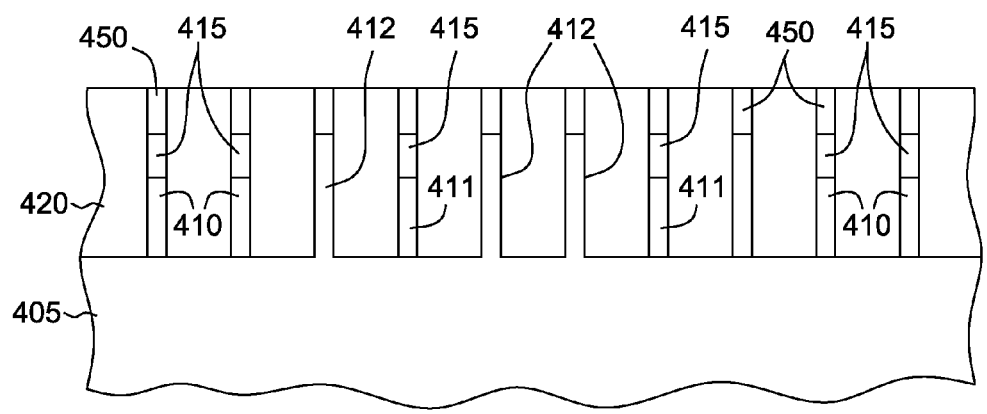

FIG. 4B depicts the structure 400 of FIG. 4A following forming of one or more fins above the substrate and deposition of a first dielectric material 420 between the one or more fins. The one or more fins 410/415, 411/415 may be formed, for example, by using a masking layer 450, such as a patterned hard mask layer, to etch one or more trenches through masking layer 350, second material 315, and first material 410, as well as third material 411 if included, to define fins above substrate 405. In one embodiment the one or more fins have base fin portions 410 formed from the first material and upper fin portions 415 formed from the second material, the upper fin portions having outer surfaces around which gate structures may subsequently be formed. In exemplary embodiments, base fin portions 410 are first base fin portions and the structure further includes second base fin portions 411 formed of the third material. As illustrated in the example of FIG. 4B, one or more fins 412 may not have base fin portions and upper fin portions, but may simply be formed out of substrate 405 and/or second material 415. Such fins may, in subsequent processing, be removed to form trenches in substrate 405, as described below. First dielectric material 420 may be disposed between fins 410/415 and 411/415 to, for example, electrically isolate fins from each other.

Figure 4C:
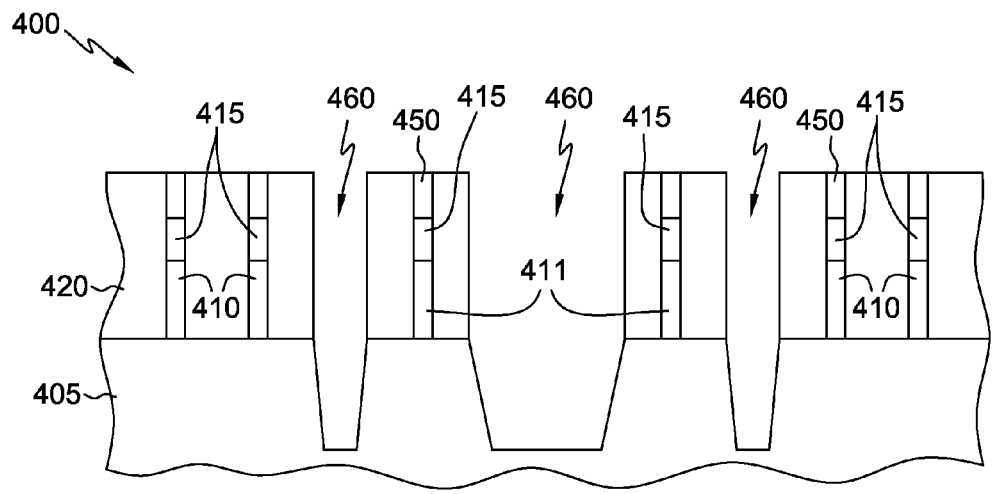

FIG. 4C depicts the structure 400 of FIG. 4B following removing at least a portion of at least one of the one or more fins, such as fins 412 from FIG. 4B, in which the removing forms at least one trench 460 in the substrate 405. As discussed above, fabrication techniques for many circuit structures, such as SRAM unit cells, include a "fin cutting" step to remove portions of at least one fin, or to remove portions of several fins as well as remove entire fins, in order to form isolation trenches between remaining fins within a circuit structure and/or between separate circuit structures formed on the same substrate 405. The removing of at least a portion of at least one of the one or more fins 412 may, for example, be accomplished by a lithographic etching in which, for instance, a patterned photo-resist (not depicted) is used to protect some fins from etching and allow other fins, along with a portion of the underlying substrate 405, to be etched.

Figure 4D:
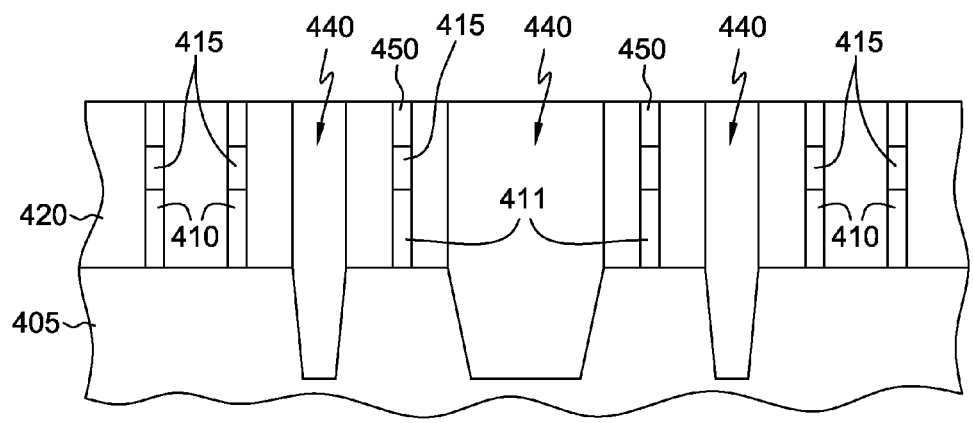
Figure 4E:
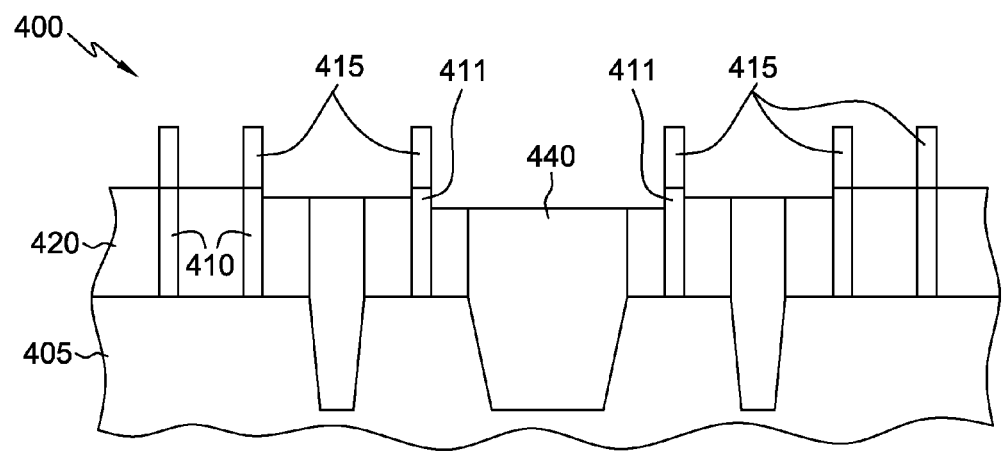

FIG. 4D depicts the structure 400 of FIG. 4C following providing of a second dielectric material 440 in the at least one trench 460 of FIG. 4C. First dielectric material 420 and second dielectric material 440 may, in one example, be planarized with patterned masking layer 450, such as by chemical-mechanical planarization, to achieve an initially uniform surface of first and second dielectric materials 420 and 440. FIG. 4E depicts first dielectric material 420 and second dielectric material 440 following recession of first and second dielectric materials 420, 440, such as by a dry-etching technique, to a depth sufficient to expose at least the outer surfaces of upper fin portions 415.

Figure 4F:
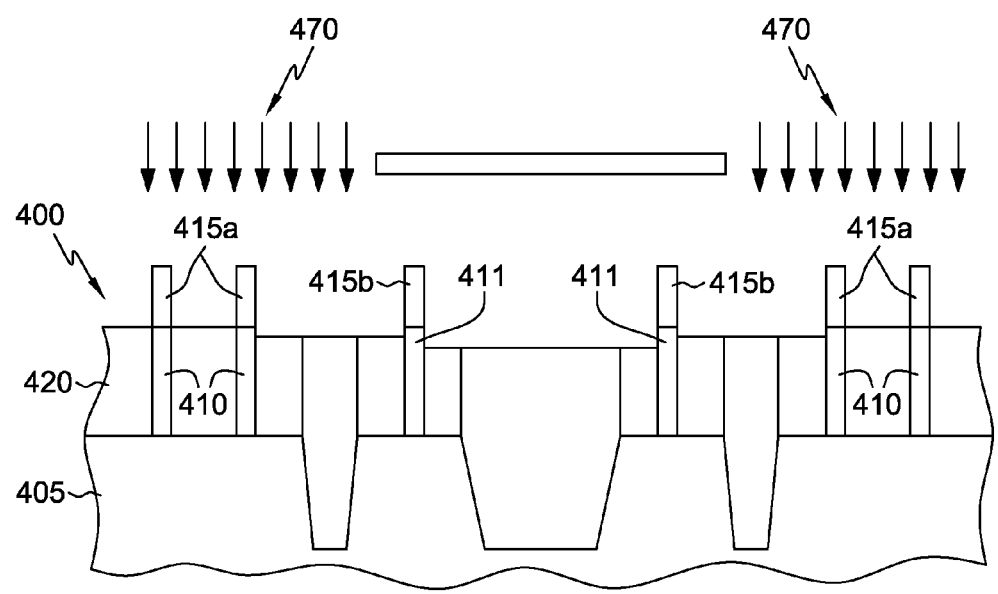
Figure 4G:
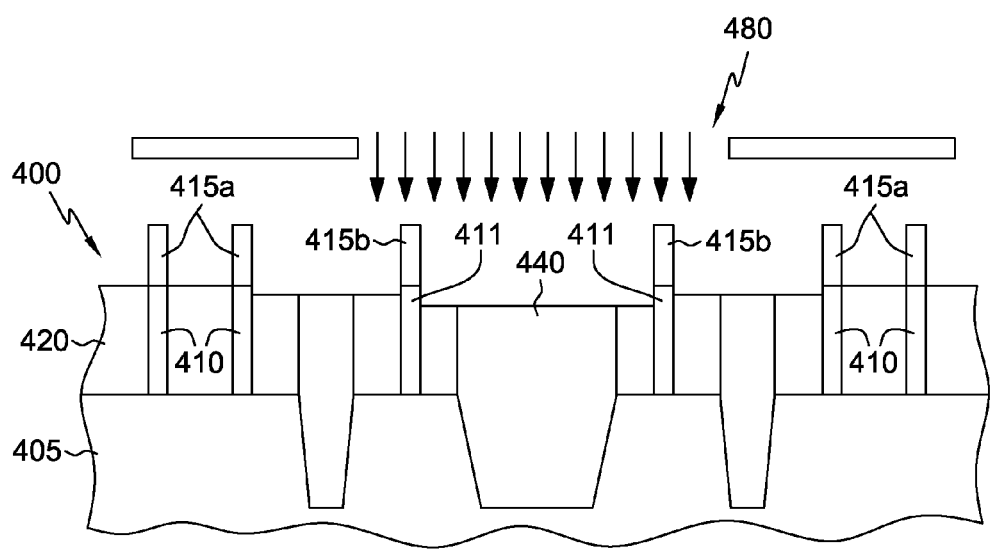

FIGS. 4F and 4G depict the structure 400 of FIG. 4E as upper fin portions 415a and 415b are implanted with dopant materials. FIG. 4F depicts first upper fin portions 415a above first base fin portions 410 being implanted 470 with a second dopant having the same conductivity or doping type as the first dopant of first base fin portions 410. Second upper fin portions 415b above second base fin portions 411 are masked during implanting 470 as illustrated. First base fin portions 410 may have a first dopant concentration and first upper fin portions 415a may have a second dopant concentration, with the second dopant concentration being different from the first dopant concentration. In general, the threshold voltage of a material containing a dopant is proportional to the dopant concentration, so that a higher dopant concentration results in a higher threshold voltage for the material. Thus, in exemplary embodiments, the second dopant concentration of first upper fin portions 415a is selected to be lower than the first dopant concentration of first base fin portions 410, resulting in first base fin portions 410 having a higher threshold voltage than first upper fin portions 415a. For example, in one exemplary embodiment, the second dopant concentration of first upper fin portions 415a may be about $1E16/cm^3$, and the first dopant concentration of first base fin portions 410 may be about $1E17/cm^3$, resulting in a threshold voltage difference between first base fin portions 410 and first upper fin portions 415a of about 0.3 volts.

Similarly, FIG. 4G depicts second upper fin portions 415b above second base fin portions 411 being implanted 480 with a fourth dopant having the same conductivity or doping type as the third dopant of second base fin portions 411. First upper fin portions 415a above first base fin portions 410 are masked during implanting 480 as illustrated. Second base fin portions 411 may have a third dopant concentration and second upper fin portions 415b may have a fourth dopant concentration, with the fourth dopant concentration being different from the third dopant concentration. In exemplary embodiments, the fourth dopant concentration of second upper fin portions 415*b* is selected to be lower than the third dopant concentration of second base fin portions 410, resulting in second base fin portions 410 having a higher threshold voltage than second upper fin portions 415*a*.

In exemplary embodiments, the first and second dopants have a first conductivity type or dopant type, such as n-type, and the third and fourth dopants have a second conductivity or dopant type, such as p-type. Thus, the methods described herein may further form nFET FinFET structures over one portion of substrate 405 and pFET FinFET structures over a second portion of substrate 405 within a single process flow, while also achieving a uniform channel size among said nFET and pFET structures.

Gate structures, such as the gate structures 230 of FIG. 2B, may subsequently be provided to wrap around at least a portion of the outer surfaces of upper fin portions 415*a* and 415*b* to form one or more FinFET structures. The gate structures may have an operating voltage lower than a first threshold voltage of first base fin portions 410 and higher than a second threshold voltage of first upper fin portions 415*a*. Similarly, the operating voltage of the gate structures may be lower than a third threshold voltage of second base fin portions 411 and higher than a fourth threshold voltage of second upper fin portions 415*b*. The channel sizes of the resulting FinFET structures are thus only defined by upper fin portions 415*a* and 415*b*, as described above. In exemplary embodiments, upper fin portions 415*a* and 415*b* of the resulting one or more FinFET structures have a uniform height above first base fin portions 410 and second base fin portions 411 so that the one or more FinFET structures, and both nFET and pFET structures, have a uniform channel size.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
    providing a substrate and a first material having a first threshold voltage above the substrate, and a second material above the first material, the second material having a second threshold voltage lower than the first threshold voltage;
    forming one or more fins above the substrate, the one or more fins having base fin portions formed from the first material and upper fin portions formed from the second material, the upper fin portions having outer surfaces;
    providing gate structures over the one or more fins to form one or more FinFET structures, wherein the gate structures wrap around at least a portion of the outer surfaces of the upper fin portions; and
    wherein an operating voltage of the gate structures is lower than the first threshold voltage and higher than the second threshold voltage, so that the upper fin portions define a channel size of the one or more FinFET structures.

2. The method of claim 1, wherein at least one gate structure of the gate structures further contacts at least a portion of a respective at least one base fin portion of at least one FinFET structure, and wherein the operating voltage of the at least one gate structure being lower than the first threshold voltage of the first material facilitates preventing the at least one base fin portion from defining the channel size of the at least one FinFET structure.

3. The method of claim 1, wherein the upper fin portions of the one or more FinFET structures have a uniform height above the base fin portions so that the one or more FinFET structures have a uniform channel size.

4. The method of claim 3, wherein providing the second material above the first material comprises forming a layer of the second material to a uniform thickness above the first material, the uniform thickness facilitating forming upper fin portions having the uniform height above the base fin portions.

5. The method of claim 1, wherein forming the one or more fins comprises disposing a first dielectric material between the one or more fins, and wherein the method further comprises:
    removing at least a portion of at least one of the one or more fins, the removing forming at least one trench in the substrate;
    providing a second dielectric material disposed in the at least one trench in the substrate; and
    recessing the first dielectric material and second dielectric material, prior to providing gate structures over the one or more fins, to a depth sufficient to expose at least the outer surfaces of the upper fin portions.

6. The method of claim 1, wherein the first threshold voltage is defined in part by a first band-gap of the first material, and the second threshold voltage is defined in part by a second band-gap of the second material, and wherein the second band-gap is selected to be smaller than the first band-gap.

7. The method of claim 1, wherein providing the first material comprises implanting a dopant into at least a portion of the substrate to form at least one doped region, the base fin portions are formed from the at least one doped region, and wherein providing the second material above the first material comprises providing a layer of the second material over the substrate and the at least one doped region.

8. The method of claim 7, wherein the dopant is a first dopant having a conductivity type, and the method further comprises implanting a second dopant into the upper fin portions, the second dopant having a same conductivity type as the first dopant.

9. The method of claim 8, wherein the base fin portions have a first dopant concentration, and wherein the upper fin portions have a second dopant concentration, the second dopant concentration differing from the first dopant concentration.

10. The method of claim 9, wherein the first threshold voltage is defined in part by the first dopant concentration, and the second threshold voltage is defined in part by the second dopant concentration, and wherein the second dopant concentration is selected to be lower than the first dopant concentration.

11. The method of claim 8, wherein the dopant is a first dopant having a first conductivity type, the at least a portion of the substrate is a first portion of the substrate, the at least one doped region is a first doped region, and the base fin portions formed from the first doped region are first base fin portions, and the method further comprises providing a third material above the substrate by implanting a third dopant into a second portion of the substrate to form a second doped region, wherein second base fin portions are formed from the second doped region, and wherein providing the second material further comprises providing a layer of the second material over the substrate and the first doped region and the second doped region.

12. The method of claim 11, wherein conductivity type of the first and second dopant is a first conductivity type, and wherein the third dopant has a second conductivity type, the second conductivity type being different from the first conductivity type.

13. The method of claim 12, wherein the upper fin portions over the first base fin portions are first upper fin portions, and the method further comprises implanting a fourth dopant into second upper fin portions over the second base fin portions, the fourth dopant having the same conductivity type as the third dopant.

14. The method of claim 13, wherein the second base fin portions have a third dopant concentration of the third dopant, and wherein the second upper fin portions have a fourth dopant concentration of the fourth dopant, the fourth dopant concentration differing from the third dopant concentration.

15. The method of claim 14, further comprising a third threshold voltage defined in part by the third dopant concentration of the second base fin portions, a fourth threshold voltage defined in part by the fourth dopant concentration of the second upper fin portions, and wherein the fourth dopant concentration is selected to be lower than the third dopant concentration so that the operating voltage of the gate structures is higher than the fourth threshold voltage and lower than the third threshold voltage.

16. A structure comprising:
    a circuit structure comprising one or more FinFET structures above a substrate, the one or more FinFET structures comprising:
        one or more fins above the substrate, the one or more fins having base fin portions of a first material having a first threshold voltage and upper fin portions of a second material having a second threshold voltage, the second threshold voltage being lower than the first threshold voltage;
        gate structures over the one or more fins, the gate structures wrapping around at least a portion of the upper fin portions of the one or more fins; and
        wherein an operating voltage of the gate structures is lower than the first threshold voltage and higher than the second threshold voltage, so that a channel size of the one or more FinFET structures is defined only by the upper fin portions of the one or more fins.

17. The structure of claim 16, wherein the first threshold voltage is defined in part by a first band-gap between a valence band and conduction band of the first material, wherein the second threshold voltage is defined in part by a second band-gap between a valence band and a conduction band of the second material, and wherein the second band-gap is larger than the first band-gap.

18. The structure of claim 16, wherein the upper fin portions of the one or more FinFET structures have a uniform height above the base fin portions so that the one or more FinFET structures have a uniform channel size.

19. The structure of claim 16, wherein at least one gate structure of the gate structures further contacts at least a portion of a respective at least one base fin portion of at least one FinFET structure, and wherein the operating voltage of the at least one gate structure being lower than the first threshold voltage of the first material facilitates preventing the at least one base fin from defining the channel size of the at least one FinFET structure.

20. The structure of claim 16, wherein the first material comprises a first dopant and the second material comprises a second dopant, the first dopant and the second dopant having a same conductivity type, and wherein the base fin portions have a first dopant concentration of the first dopant and the upper fin portions have a second dopant concentration of the second dopant, the second dopant concentration being lower than the first dopant concentration.

\* \* \* \* \*